United States Patent
Tetelbaum

(10) Patent No.: US 6,880,141 B1
(45) Date of Patent: Apr. 12, 2005

(54) WIRE DELAY DISTRIBUTED MODEL

(75) Inventor: Alexander Tetelbaum, Hayward, CA (US)

(73) Assignee: LSI Logic Corporation, Milpitas, CA (US)

( * ) Notice: Subject to any disclaimer, the term of this patent is extended or adjusted under 35 U.S.C. 154(b) by 692 days.

(21) Appl. No.: 09/827,434

(22) Filed: Apr. 6, 2001

Related U.S. Application Data

(63) Continuation-in-part of application No. 09/771,272, filed on Jan. 26, 2001, now Pat. No. 6,543,038.
(60) Provisional application No. 60/236,752, filed on Sep. 28, 2000, and provisional application No. 60/236,902, filed on Sep. 28, 2000.

(51) Int. Cl.[7] ............................................. G06F 17/50
(52) U.S. Cl. .................................. 716/6; 716/1; 716/4
(58) Field of Search .................................... 716/6, 4, 1

(56) References Cited

U.S. PATENT DOCUMENTS

| | | | | |
|---|---|---|---|---|
| 5,469,366 A | * | 11/1995 | Yang et al. ..................... | 716/6 |
| 6,044,209 A | * | 3/2000 | Alpert et al. ................... | 716/6 |
| 6,347,393 B1 | * | 2/2002 | Alpert et al. ................... | 716/2 |
| 6,606,587 B1 | * | 8/2003 | Nassif et al. ................... | 703/14 |

OTHER PUBLICATIONS

Kashyap et al., "An "Effective" Capacitance Based Delay Metric for RC Interconnect", IEEE, 2000.*
Lukas Van Ginneken, "Buffer Placement in Distributed RC–Tree Networks for Minimal Elmore Delay", IBM, Thomas J. Watson Research Center, IEEE, 1990, pp. 865–868.*
IBM Technical Disclosure Bulletin, "Buffer Placement in Distributed RC Tree Networks for Minimal Elmore Delay", vol. 33, No. 8 Jan. 1991, pp. 338–341.*

* cited by examiner

*Primary Examiner*—Vuthe Siek
*Assistant Examiner*—Brandon Bowers
(74) *Attorney, Agent, or Firm*—Trexler, Bushnell, Giangiorgi & Blackstone, Ltd.

(57) ABSTRACT

An improved method of using the Elmore Model to estimate the delay which is associated with the a clock buffer output. The improved method provides that the clock buffer output resistor is taken into account when the Elmore Model is used to calculate the delay. Also provided is a method of using the Elmore Model to estimate wire delay, where the method includes steps of calculating an approximate delay based on a distributed RC model, and using a capacitance value corresponding to the approximate delay in the Elmore Model to estimate the wire delay.

14 Claims, 5 Drawing Sheets

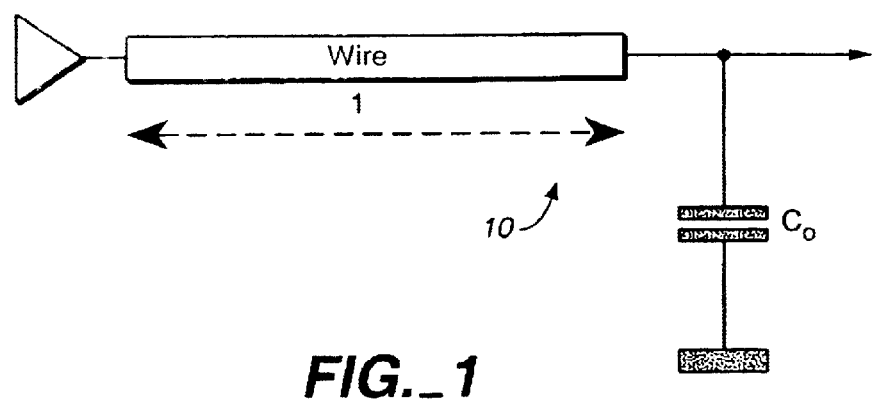
FIG._1
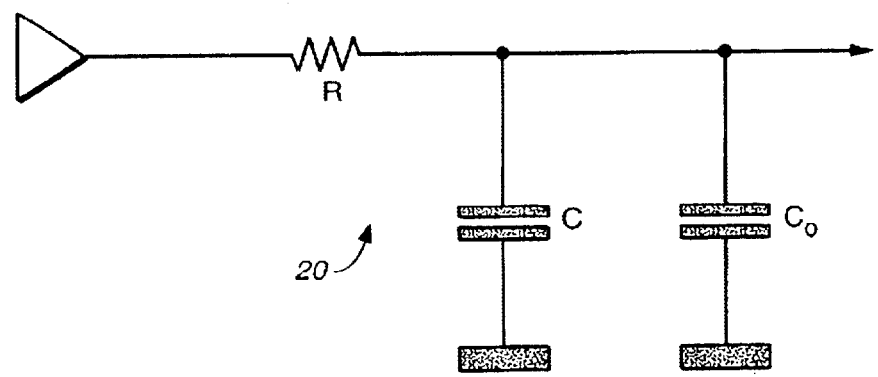
FIG._2
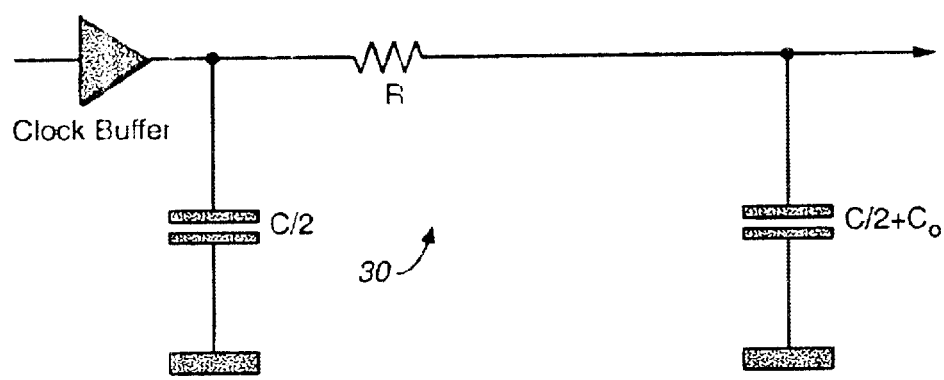
FIG._3

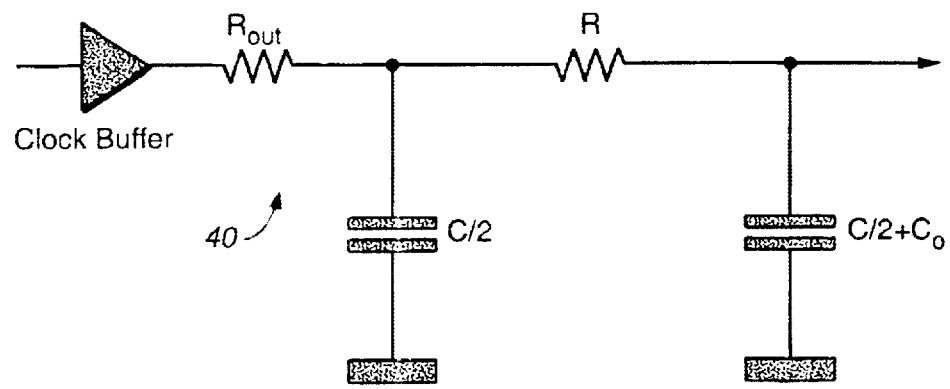
FIG._4
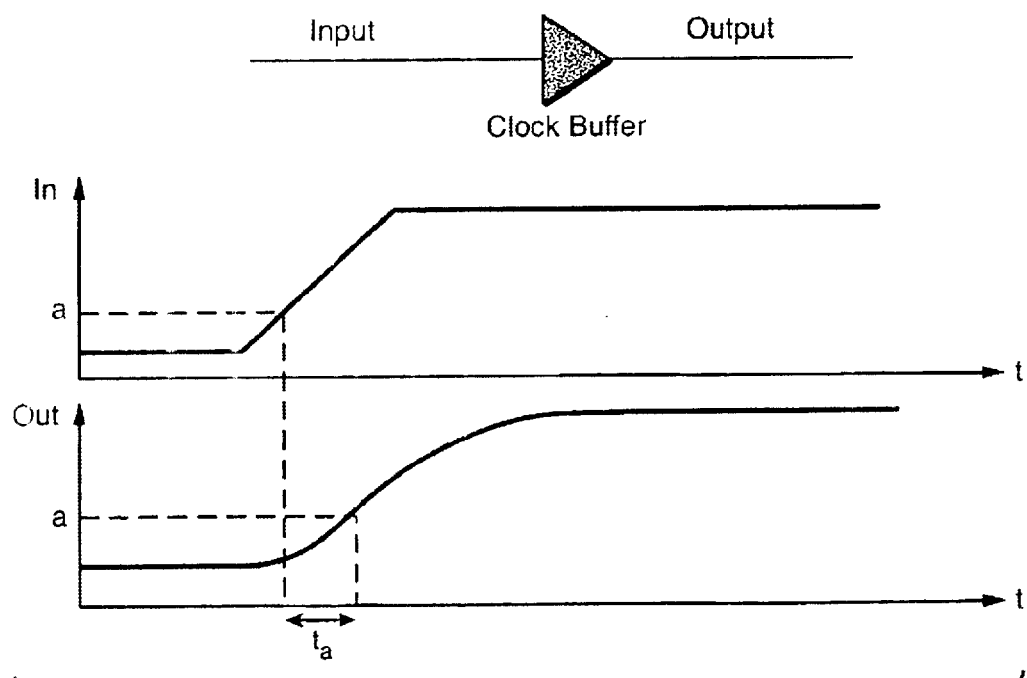
FIG._5

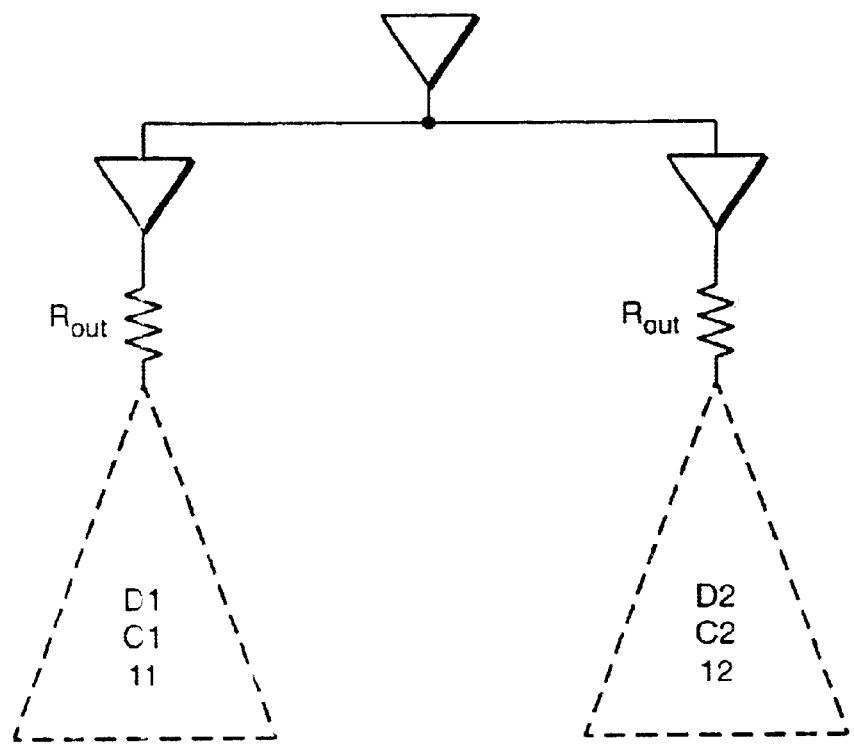
FIG._6
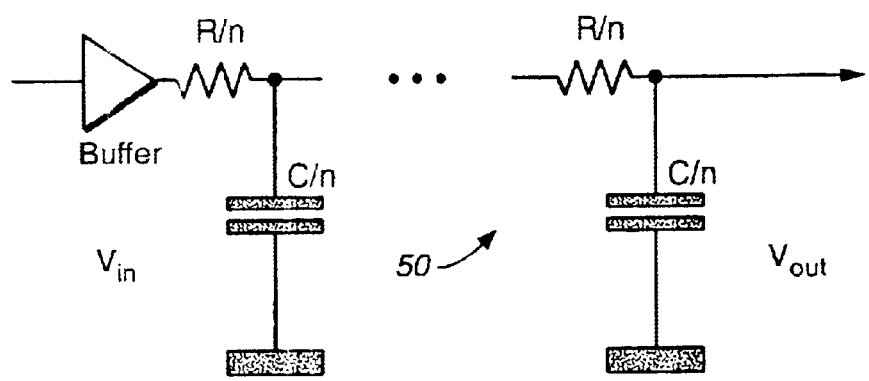
FIG._7

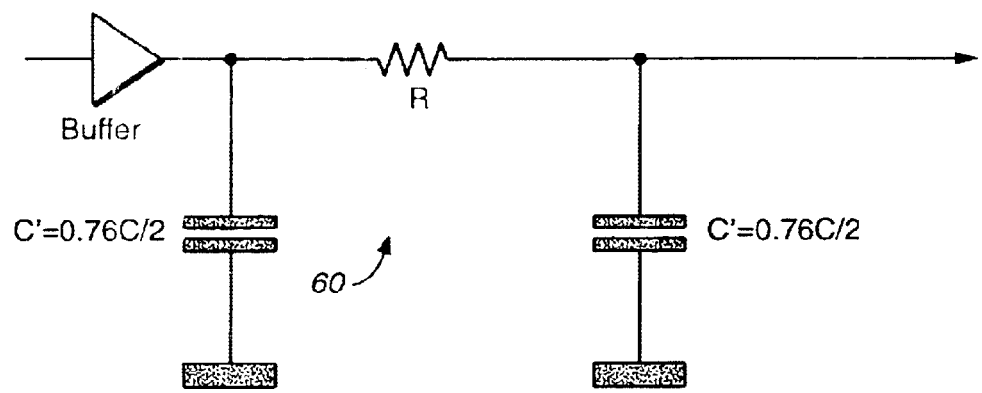
FIG._8
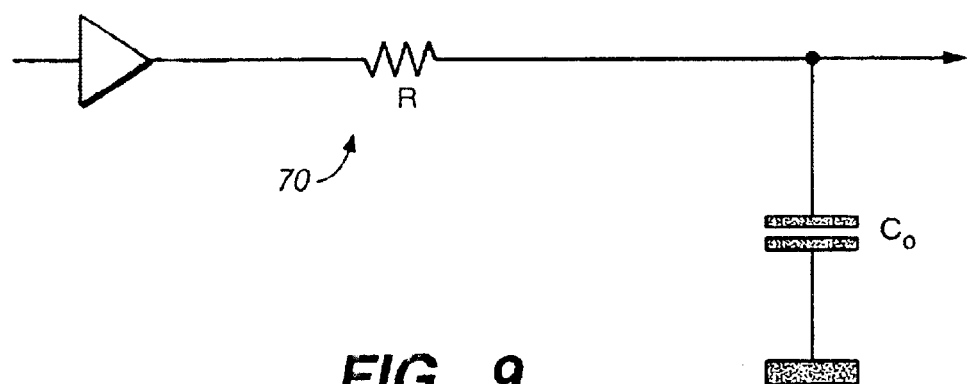
FIG._9
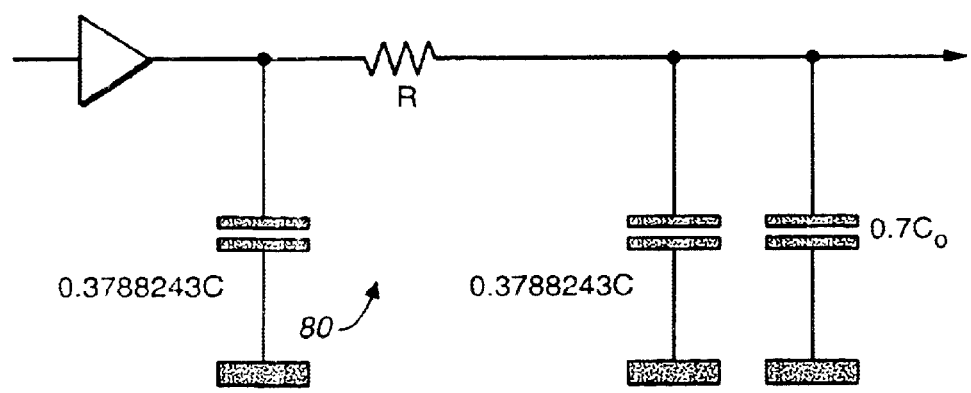
FIG._10

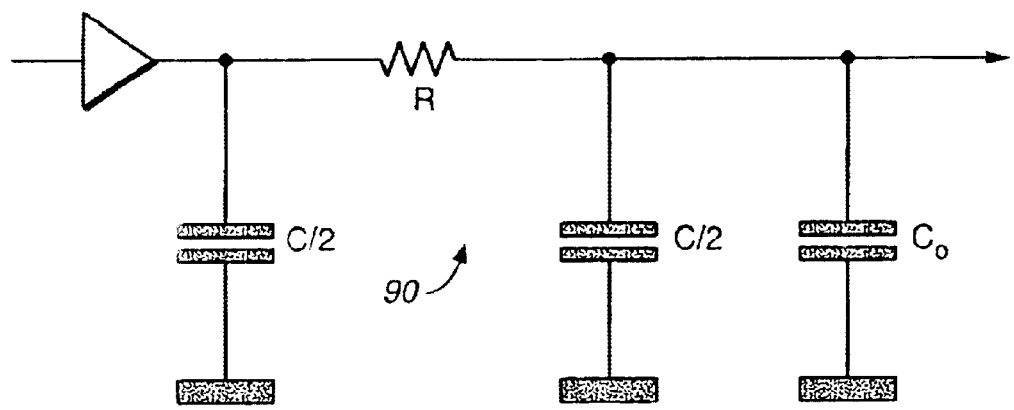
FIG._11
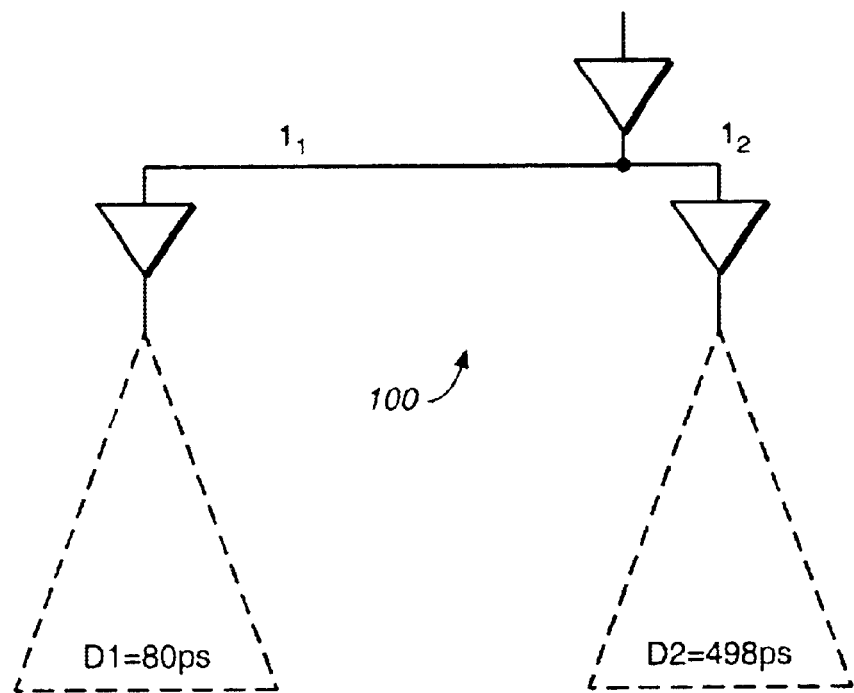
FIG._12

US 6,880,141 B1

WIRE DELAY DISTRIBUTED MODEL

RELATED APPLICATIONS

This application claims the benefit of U.S. Provisional Application Ser. No. 60/236,752, filed Sep. 28, 2000, and U.S. Provisional Application Ser. No. 60/236,902, filed Sep. 28, 2000, and is a continuation-in-part of U.S. patent application Ser. No. 09/771,272, filed Jan. 26, 2001, now U.S. Pat. No. 6,543,038.

BACKGROUND

This invention generally relates to the Elmore Model, and more specifically relates to enhancements to the Elmore Model so that wire delays can be more accurately estimated.

The Elmore Model is a mathematical model which is used to estimate the delays at tapping points along a RC line. In other words, it is a tool for estimating the delay associated with providing a signal over a wire to a capacitive load. The Elmore Model is widely used in circuit design. For example, the Elmore Model is widely used during construction of a balanced clock tree (BCT) at different levels of clock net partition. The Elmore Model is described in several publications. For example, see W. C. Elmore, "The transient response of damped linear networks with particular regard to wide-band amplifier", J Applied Physics, Vol. 19, no. 1, pp. 55–63, January 1948, and J. Vlach, "Numerical method for transient responses of linear networks with lumped, distributed or mixed parameters" Journal of the Franklin Institute, Vol. 288, No. 2, pp. 99–113, August 1969. Generally, one having ordinary skill the art is very familiar with the Elmore Model.

While the Elmore Model is a helpful model to use for wire delay estimations, the Elmore Model is not perfect, and very often introduces some error. In other words, the actual or real delay is often different than the delay as calculated using the Elmore Model. This error may be compounded when attempting to calculate skew using the Elmore Model, where one delay calculation is compared to another. Obviously, if the Elmore Model were to be improved or enhanced, estimations using the Elmore Model would be more accurate. This would improve designs. For example, if the Elmore Model were to be improved or enhanced, clock skew can be minimized among partition groups in a balanced clock tree (BCT).

Additionally, in the prior art, when the Elmore Model is used to estimate the delay associated a clock buffer output, the output resistor of the clock buffer is not considered, and this impacts delay and clock skew estimations.

OBJECTS AND SUMMARY

A general object of an embodiment of the present invention is to provide enhancements to the Elmore Model for more accurately estimating wire delays.

Another object of an embodiment of the present invention is to provide an improved method of using the Elmore Model to estimate the delay associated a clock buffer output, where the method includes taking into account the clock buffer output resistance.

Another object of an embodiment of the present invention is to provide a method of more accurately estimating delays using the Elmore Model, where the Elmore Model is based on a wire delay distributed model.

Briefly, and in accordance with at least one of the foregoing objects, an embodiment of the present invention provides an improved method of using the Elmore Model to estimate the delay which is associated with the a clock buffer output. The improved method provides that the clock buffer output resistor is taken into account when the Elmore Model is used to calculate the delay.

Preferably, the Elmore Model is used to estimate the delay associated with the clock buffer output without taking into account the clock buffer output resistance. Then, the Elmore Model is used to estimate the delay associated with the clock buffer output while taking into account the clock buffer output resistance. Then, the estimated delays are used to calculate the maximum skew error associated with the clock buffer output resistance. Estimated ramp values of the clock buffer input and output signals are used to calculate the value of the clock buffer output resistance.

Another embodiment of the present invention provides a method of using the Elmore Model to estimate wire delay, and the method includes the steps of formulating a distributed RC model, calculating an approximate delay based on the distributed RC model, calculating a capacitance value based on the approximate delay which has been calculated, and using the capacitance value in the Elmore Model to estimate the wire delay.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which:

FIG. 1 is a schematic view of a representative arrangement where a length (l) of wire is used to supply a signal to a capacitive load ($C_o$);

FIG. 2 is an RC model of that which is shown in FIG. 1;

FIG. 3 is an Elmore Model circuit based on that which is shown in FIGS. 1 and 2, wherein a clock buffer output resistor is not taken into account;

FIG. 4 is an Elmore Model circuit which is in accordance with an embodiment of the present invention, wherein the clock buffer output resistor is taken into account;

FIG. 5 shows the input and output leads of a clock buffer and signal parameters relating thereto;

FIG. 6 is a schematic view relating to the estimation of skew error;

FIG. 7 illustrates a distributed RC model;

FIG. 8 illustrates a wire lumped model;

FIG. 9 illustrates an RC circuit;

FIG. 10 is an Elmore Model circuit which is in accordance with an embodiment of the present invention;

FIG. 11 is a conventional or classical Elmore Model circuit; and

FIG. 12 is a schematic view illustrating a balancing example.

DESCRIPTION

While the invention may be susceptible to embodiment in different forms, there are shown in the drawings, and herein will be described in detail, specific embodiments with the understanding that the present disclosure is to be considered an exemplification of the principles of the invention, and is not intended to limit the invention to that as illustrated and described herein.

A first embodiment of the present invention will now be described with reference to FIGS. 1–6. The embodiment provides that a clock buffer output resistor is calculated, and then the resistor is taken into account when using the Elmore Model to estimate delays and skew. This provides for more accurate estimations using the Elmore Model, as well as increases system performance and improves design quality.

FIG. 1 depicts a representative arrangement 10 where a length (l) of wire is used to supply a signal to a capacitive load ($C_o$). An RC Model 20 of the arrangement is shown in FIG. 2. The real theoretical delay for this RC circuit is:

$$D_{Real}=RCln2=0.7\ RC \text{ or} \qquad (1)$$

$$D_{Real}=0.7\ rl(cl+C_o) \text{ or} \qquad (2)$$

$$D_{Real}=0.7\ rcl(1+L_o) \qquad (3)$$

where r is the resistance and c is the capacitance of a unit length of wire, and $L_o=C_o/c$.

Illustrated in FIG. 3 is the Elmore Model equivalent 30 of that which is shown in FIGS. 1 and 2, wherein the clock buffer output resistor is not taken into account. Mathematically applying the Elmore Model to that which is shown in FIG. 3 provides:

$$D_{Without}=R(C/2+C_o) \text{ or} \qquad (4)$$

$$D_{Without}=0.5rcl(1+L_o), \qquad (5)$$

where r and c are unit length and capacitance, respectively, of the wire and is the resistance and c is the capacitance of a unit length of wire, and $L_o=C_o/c$.

FIG. 4 shows an Elmore Model circuit 40 wherein the clock buffer output resistor ($R_{out}$) is taken into account. Mathematically applying the Elmore Model to that which is shown in FIG. 4 provides:

$$D_{With}=R_{Out}(C+C_o)+D_{Without} \qquad (6)$$

The error in delay (Diff) as a result of not taking the clock buffer output resistor into account in the Elmore Model is effectively the difference between equations 4 and 6, or:

$$Diff=D_{With}-D_{Without}=R_{Out}(C+C_o). \qquad (7)$$

FIG. 5 shows the clock buffer input ("Input") and output ("Output") leads as well as illustrates the signal characteristics and parameters relating thereto (wherein "In" relates to the "Input" lead, and "Out" relates to the "Output" lead). With reference to FIG. 5:

$$R_{Out}=1000\ [t_{90}(C_{load},t_{ramp})-t_{50}(C_{load},t_{ramp})]/C_{load}ln5 \qquad (8)$$

$$t_{ramp} \Longrightarrow 0.3 \to 0.5 \text{(ramp time)} \qquad (9)$$

$$Diff=621[t_{90}(C_{load},t_{ramp})-t_{50}(C_{load},t_{ramp})]. \qquad (10)$$

For example, for clock buffer clkc16i, wherein:

$C_{load}$=5 STDL $t_{ramp}$=0.005$\Longrightarrow$ $R_{out}$=404 $\Omega$

Diff=22.46=const. (with 7.4 $\Omega$ error).

Then, the maximum skew error due to not accounting for the clock buffer output resistor can be estimated as follows, with reference to FIG. 6:

$$E_s=7.4\ |C1-C2| \qquad (11)$$

$$E_s=7.4\ c|l1-l2| \qquad (12)$$

$$E_s=0.0015|l1-l2|. \qquad (13)$$

Thus, there is about 1.5 ps of skew error for each 1000 $\mu$m of wire length. As a result of the significant error which results from not taking the clock buffer output resistor into account, it is important to, in accordance with the present invention, calculate the value of the sock output resistor, and to take the resistor into account when using the Elmore Model to estimate delay or skew. Additionally, it is apparent (from equations 12 and 13) that it would prove advantageous to use symmetrical routing (i.e., wherein l1=l2).

Calculating the clock buffer output resistor and taking the resistor into account when using the Elmore Model to estimate delays and skew in accordance with the present invention provides for more accurate estimations using the Elmore Model. This increases system performance and improves design quality.

A second embodiment of the present invention will now be described with reference to FIGS. 1 and 7–12. The embodiment provides an improved method of using the Elmore Model to estimate wire delay, where the method includes steps of calculating an approximate delay based on a distributed RC model, and using a capacitance value corresponding to the approximate delay in the Elmore Model to estimate the wire delay. As a result, more accurate estimations can be made using the Elmore Model, and this increases system performance and improves design quality.

As discussed above, FIG. 1 depicts a representative arrangement 10 where a length (l) of wire is used to supply a signal to a capacitive load ($C_o$). The present invention provides that a wire distributed model is used together with an Elmore Model. A distributed RC Model 50 is shown in FIG. 7.

The step response of a uniform distributed RC wire is given in the Laplace domain by:

$$V_{out} = \frac{V_{in}}{s\cosh(\sqrt{sRC})} \qquad (14)$$

where C is the the total wire capacitance and R is the total wire resiatence.

The exact time domain response is given by the infinite series:

$$V_{out}(t) = 1 - \frac{4}{\pi}\sum_{n=0}^{\infty}\frac{(-1)^n}{2n+1}\exp\left[-\left(\frac{2n+1}{2}\pi\right)^2 \cdot \frac{t}{RC}\right] \qquad (15)$$

which can be re-written as follows:

$$V_{out}(t) = 1 - \frac{4}{\pi}\sum_{n=0}^{\infty}\frac{(-1)^n}{2n+1}X^{-(\frac{2n+1}{2}\pi)^2} \qquad (16)$$

where $X=e^{t/RC}$.

The delay $D_{distributed}$ of the RC distributed model can be found from the equation:

$$V_{out}(D_{distributed})=0.5 \qquad (17)$$

A numerical solution is X=1.460448 with $10^{-12}$ accuracy. Then $$e^{Ddistributed/RC}=X=1.460448 \qquad (18)$$

and $$D_{distributed}=RClnX=0.3788243\ RC. \qquad (19)$$

With $10^{-5}$ accuracy, only one member of the exact formula can be used as follows:

$$V_{out}(t) = 1 - \frac{4}{\pi}\exp\left[-\left(\frac{\pi}{2}\right)^2 \cdot \frac{t}{RC}\right] = 0.5 \qquad (20)$$

Then, the approximate delay is:

$$D'_{distributed} = RC\frac{\ln\left(\frac{\pi}{8}\right)}{-\left(\frac{\pi}{2}\right)^2} = 0.3788243 RC \qquad (21)$$

An improved Elmore Model for estimating the delay of a wire would preserve all Elmore delay properties and produce a more accurate estimation of eth delay according to the above-described theory. FIG. 8 illustrates a Wire Lumped Model 60 wherein the exact value of the capacitors are C'=0.3788243 C. Thus, instead of the total wire capacitance C (that is typically used in association with a conventional or classical Elmore Model), 2*0.3788243 C capaciatnce should be used to provide more accurate estimations.

The error associated with using a conventional or classical Elmore Model rather than an Elmore Model based on a distributed Rc model and modified capacitance values can be described as follows:

the delay along the wire is:

$$D_{distributed}=0.3788243\ RC, \text{ or} \qquad (22)$$

$$D_{distributed}=0.3788243\ rcl^2 \qquad (23)$$

where r is the unit length resistance of the wire and c is the unit capaciatnce of the wire and $L_o=C_o/c$.

The delay which is calculated using a conventional or classical Elmore Model is:

$$D_{Elmore}=RC/2, \text{ or} \qquad (24)$$

$$D_{Elmore}=0.5rcl^2. \qquad (25)$$

Hence, the error between the distributed delay and the Elmore delay is:

$$E(l)=D_{distributed}-D_{elmore} \qquad (26)$$

$$E(l)=-0.1211757\ rcl^2 \qquad (27)$$

and the clock skew error is:

$$Es(l_1,l_2)=E(l_1)-E(l_2)=-0.1211757\ rc(l_1^2-l_2^2). \qquad (28)$$

With regard to a wire with a load, specifically an RC circuit 70 as shown in FIG. 9, the theoretical 0.5 level delay is:

$$D_{Theory}=RC_o\ln 2=0.7\ RC_o. \qquad (29)$$

Hence, the load of the wire is introduced into an improved Elmore Model as:

$$C'_o=0.7C_o. \qquad (30)$$

Considering a wire with a nonzero load $C_o$, and substituting the wire with its improved Elmore Model value and the load with its improved value of 0.7 $C_o$, provides as shown in FIG. 10. FIG. 10 illustrates such an improved Elmore Model 80, wherein the Model is in accordance with the present invention.

The following illustrates how to find the difference between the new improved elay value (that is equal to the theoretical value) and delay associated with the conventional or classical Elmore Model:

$$D_{improved}=R(0.3788243C+0.7C_o) \qquad (31)$$

$$D_{improved}=rl(0.3788243cl+0.7C_o) \qquad (32)$$

$$D_{improved}=rcl(0.37882431+0.7L_o) \qquad (33)$$

where r and c are unit length resistance and capacitance, respectively, of the wire and $L_o=C_o/c$. A conventional or classical Elmore Model 90 is shown in FIG. 11, and the delay is:

$$D_{Elmore}=R(C/2+C_o) \qquad (34)$$

$$D_{Elmore}=rcl(0.51+L_o). \qquad (35)$$

The delay error is:

$$E(l)=D_{improved}-D_{elmore} \qquad (36)$$

$$E(l)=-rcl(0.12117571+0.3L_o), \qquad (37)$$

and the skew error is:

$$Es(l_1,l_2)=E(l_1)-E(l_2)=-rc[0.1211757(l_1^2-l_2^2)+0.3L_o(l_1-l_2)]. \qquad (38)$$

Hence, it can be seen that for the classical Elmore Model a large $|l_1-l_2|$ leads to big skew error and, therefore, a big skew. Minimization of $|l_1-l_2|$ leads to skew minimization in all cases.

FIG. 12 shows a balancing example 100 which approximates real designs. In FIG. 12:

r=0.07;
c=0.0002;
$C_o$=4 STDLs=0.0448;
Lo=224;
$l_1$=7600 and $l_2$=1000.
With reference to FIG. 12, $$D_{Elmore}(l_1)=rcl_1(0.5\ l_1+L_o)=428\ ps \qquad (39)$$

$$D_{Elmore}(l_2)=rcl_2(0.5\ l_2+L_o)=10\ ps \qquad (40)$$

$$D_{Elmore}(l_1)+D1=D_{Elmore}(l_2)+D2=508\ ps \qquad (41)$$

$$D_{improved}(l_1)=rcl_1(0.3788243l_1+0.7L_o)=323\ ps \qquad (42)$$

$$D_{improved}(l_1)=rcl_2(0.3788243l_2+0.7L_o)=7.5\ ps \qquad (43)$$

$$D_{improved}(l_1)+D1=403\ ps \qquad (44)$$

$$D_{improved}(l_2)+D2=505.5\ ps \qquad (45)$$

$$\text{Skew Error}=505.5\ ps-403\ ps=102.5\ ps \qquad (46)$$

If two independent wires are considered, then:

$$D_{improved}=ln2D_{Elmore} \qquad (47)$$

By using an improved Elmore Model in accordance with the present invention (i.e. by using a distributed model), more accurate delay and skew estimations can be made, and this increases system performance and improves design quality.

While embodiments of the present invention are shown and described, it is envisioned that those skilled in the art may devise various modifications of the present invention without departing from the spirit and scope of the appended claims.

What is claimed is:

1. A method for estimating wire delay, said method comprising: formulating a distributed RC model; calculating an approximate delay based on the distributed RC model;

calculating a capacitance value based on the approximate delay which has been calculated; using the capacitance value in the Elmore Model to estimate the wire delay, calculating a wire delay using the Elmore Model without using a distributed RC model, and calculating clock skew error using the distributed delay which has been calculated and the wire delay which has been calculated using the Elmore Model without using a distributed RC model.

2. A method as recited in claim 1, further comprising calculating a time domain response relating to the wire.

3. A method as recited in claim 2, using the time domain response which has been calculated to calculate the approximate delay based on the distributed RC model.

4. A method a recited in claim 1, wherein the capacitance value which is calculated is a fraction of a total wire capacitance.

5. A method for calculating clock skew error comprising: formulating a distributing RC model; calculating an approximate delay based on the distributed RC model; calculating a capacitance value based on the approximate delay which has been calculated; using the capacitance value in the Elmore Model to estimate the wire delay; and subtracting the wire delay which has been calculated using the Elmore Model without using a distributed RC model from the distributed delay which has been calculated in order to calculate clock skew error.

6. A method as recited in claim 5, further comprising calculating a time domain response relating to the wire.

7. A method as recited in claim 6, using the time domain response which has been calculated to calculate the approximate delay based on the distributed RC model.

8. A method as recited in claim 6, wherein the capacitance value which is calculated is a fraction of a total wire capacitance.

9. A method as recited in claim 6, further comprising calculating a wire delay using the Elmore Model without using a distributed RC model.

10. A method as recited in claim 9, further comprising calculating clock skew error using the distributed delay which has been calculated and the wire delay which has been calculated using the Elmore Model without using a distributed RC model.

11. A method for estimating wire delay, said method comprising: formulating a distributed RC model; calculating an approximate delay based on the distributed RC model; calculating a capacitance value based on the approximate delay which has been calculated; using the capacitance value in the Elmore Model to estimate the wire delay, calculating a Wire delay without using a distributed RC model; ad calculating clock skew err using the distributed delay and wire delay which have been calculated.

12. A method as recited in claim 11, further comprising calculating a time domain response relating to the wire.

13. A method as recited in claim 12, using the time domain response which has been calculated to calculate the approximate delay based on the distributed RC model.

14. A method as recited in claim 11, wherein the capacitance value which is calculated is a fraction of a total wire capacitance.

* * * * *